United States Patent [19]

Hughes

[11] Patent Number: 5,028,822
[45] Date of Patent: Jul. 2, 1991

[54] CIRCUIT ARRANGEMENT FOR PROCESSING ANALOGUE ELECTRICAL SIGNALS

[75] Inventor: John B. Hughes, Hove, England

[73] Assignee: U.S. Philips Corporation, New York, N.Y.

[21] Appl. No.: 441,140

[22] Filed: Nov. 22, 1989

[30] Foreign Application Priority Data

Dec. 8, 1988 [GB] United Kingdom ................ 8828668

[51] Int. Cl.$^5$ ............................................. G05F 3/24
[52] U.S. Cl. .................................... 307/501; 323/311; 323/312; 323/315; 323/316; 323/317; 307/353
[58] Field of Search ................ 307/501, 353; 323/311, 323/312, 315, 316, 317

[56] References Cited

U.S. PATENT DOCUMENTS 4,864,217 9/1989 Bird ..................................... 323/316
4,866,368 9/1989 Bird ..................................... 323/316
4,897,596 1/1990 Hughes et al. ....................... 323/315

Primary Examiner—Stanley D. Miller
Assistant Examiner—Scott A. Ouellette
Attorney, Agent, or Firm—Bernard Franzblau

[57] ABSTRACT

A circuit arrangement for processing sampled analogue electrical signals comprises means for combining (9) in predetermined proportions on input sample current in the present sample period with current(s) derived from input sample current(s) in one or more preceding sample periods and means for deriving the processed output signal as or from the combined current produced by the combining means in successive sample periods. The circuit arrangement further comprises means for scaling a current which comprises a first branch (T1) for receiving a current to be scaled, second and third branches (T2,T3) for producing first and second sub-output currents which are proportional to the received current, means for forming the difference (2) between the first and second sub-output currents, and means for feeding the difference current to the output (3) of the current scaling means.

20 Claims, 7 Drawing Sheets

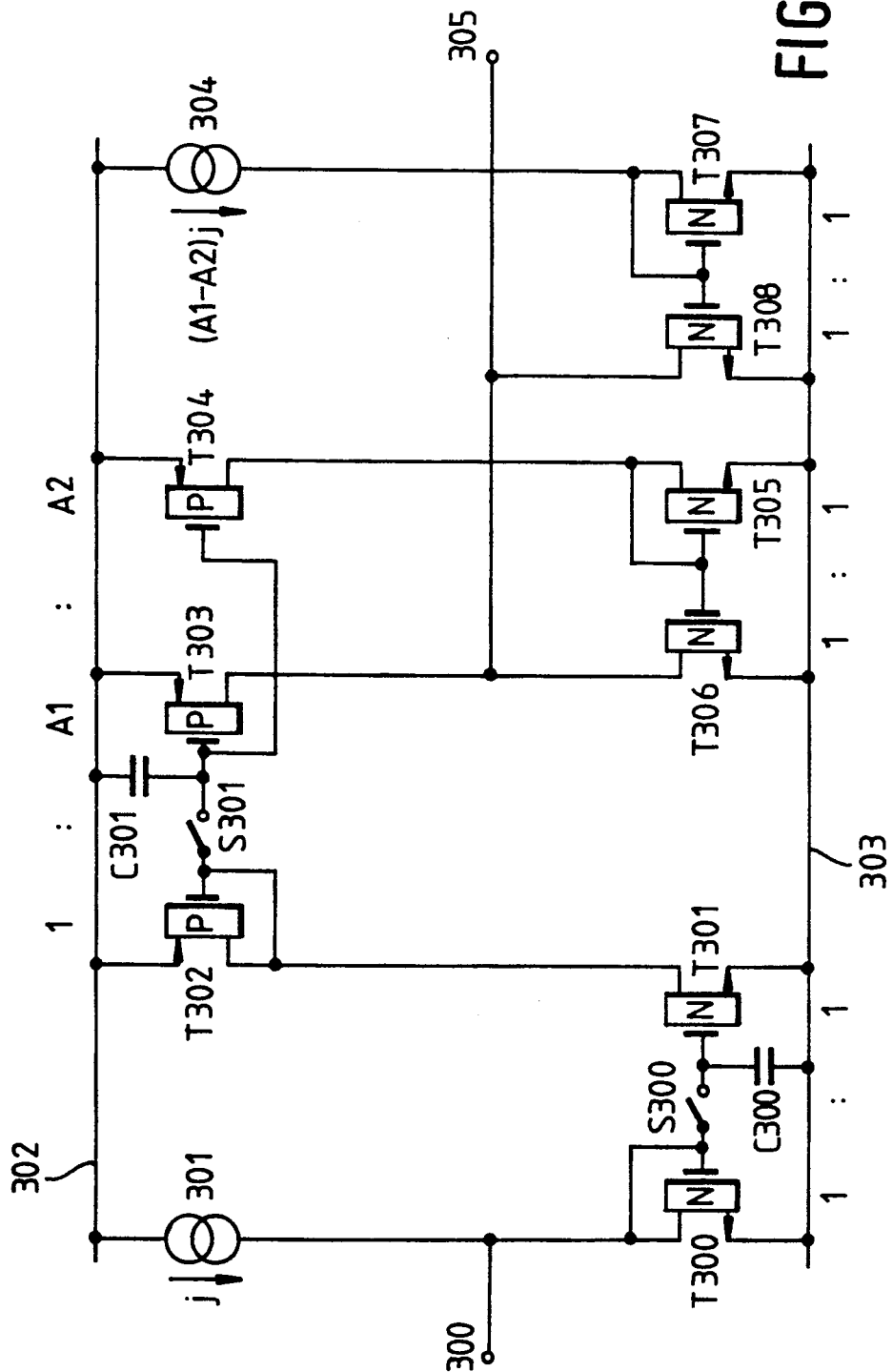

CIRCUIT ARRANGEMENT FOR PROCESSING ANALOGUE ELECTRICAL SIGNALS

BACKGROUND OF THE INVENTION

The present invention relates to a circuit arrangement for processing sampled analog electrical signals, each sample being in the form of a current, the circuit arrangement comprising means for combining in predetermined proportions the input sample current in a present sample period with current(s) derived from input sample current(s) in one or more preceding sample periods, and means for deriving the processed output signal as or from the combined current produced by the combining means in successive sample periods.

Such a circuit arrangement is disclosed in EP-A-308008, which corresponds to U.S. Pat. No. 4,864,217 (Sep. 5, 1989), and a class of such circuits has been referred to as switched current circuits. Switched current circuits can be used in place of conventional switched capacitor circuits for analog signal processing. Current mirror and/or current conveyor circuits may be used as current scaling circuits in such circuit arrangements and may implement coefficients used in the algorithms used to define circuit functions by producing the appropriate current ratios. Where these ratios are integers they can be reliably and relatively accurately achieved by using multiples of unit transistors. In general, however, the coefficients and hence the current ratios will not be integers. Clearly, the dimensions of transistors, for example, the channel width/length ratios of MOS transistors, used to implement the current mirror or current conveyor circuits could be chosen to have the desired non-integer ratios. However, if this solution is adopted there are a number of 'edge-effects' which cause errors in the active or effective channel width and consequently cause an error in defining the coefficients. Examples of such edge-effects include incorrect mask dimensions or incorrectly etched windows. The effects of these errors may be reduced by using larger transistors but this is wasteful of chip area.

Current conveyor circuits are circuits in which current is conveyed between two ports at greatly different impedance levels. The current conveyor is a three port network with three ports which can be denoted x, y, and z. Its terminal characteristics can be represented by a hybrid matrix giving the outputs of the three ports in terms of their corresponding inputs. For a first generation current conveyor (CCI), this relationship is:

$$\begin{pmatrix} i_y \\ v_x \\ i_z \end{pmatrix} = \begin{pmatrix} 0 & 1 & 0 \\ 1 & 0 & 0 \\ 0 & \pm 1 & 0 \end{pmatrix} \begin{pmatrix} v_y \\ i_x \\ v_z \end{pmatrix}$$

For a second generation current conveyor (CC2) this relationship is:

$$\begin{pmatrix} i_y \\ v_z \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_x \end{pmatrix}$$

Further information concerning current conveyors and their implementation can be obtained by reference to the paper entitled "Current Conveyors: A Review of the State of Art" by Umesh Kumar, published in IEEE Circuits and Systems Magazine Vol. 3, No. 1, 1981, pages 10 to 14 and in the references cited therein. As discussed in that publication, the transfer characteristic between ports x and z is that of a current controlled current source with a virtual short circuit at input x. The output impedance at port z can be made very high by techniques such as cascoding, thus giving a large difference between input and output impedances. The very low (virtual short circuit) input impedance allows a more accurate current summing when the input to the current conveyor forms the summing node.

SUMMARY OF THE INVENTION

It is an object of the invention to enable accurate current ratios implementing algorithm coefficients in switched current circuits, by providing scaling circuits such as current mirror and/or current conveyor circuits, in which the inaccuracies caused by edge-effects in the transistors forming the current mirror and/or current conveyor circuits are reduced.

The invention provides a circuit arrangement for processing sampled analog electrical signals, each sample being in the form of a current, the circuit arrangement comprising means for combining in predetermined proportions the input sample current in the present sample period with current(s) derived from input sample current(s) in one or more preceding sample periods, and means for deriving the processed output signal as or from the combined current produced by the combining means in successive sample periods. The circuit arrangement further comprises means for scaling a current. The scaling means comprises a first branch for receiving a current to be scaled, second and third branches for producing first and second sub-output currents which are proportional to the received current, means for forming the difference between the first and second sub-output currents, and means for feeding the difference current to the output of the current scaling means.

By forming the current ratio between the input current applied to the scaling circuit and the output current produced by the scaling circuit as the difference between current ratios in first and second branches, systematic effects causing inaccuracies can be cancelled. Consequently, a more accurate definition of the ratio of input to output current can be achieved.

The current scaling circuit may comprise a current mirror circuit, said current mirror circuit comprising an input branch formed by a first diode-connected field effect transistor, a first output branch formed by a second field effect transistor, a second output branch formed by a third field effect transistor, means for forming the difference between the currents in the first and second output branches and means for feeding the difference current to an output of the current mirror circuit.

The current ratio is defined by the difference between the current ratios of the two output branches and by taking the difference between the two currents the 'edge-effects' are cancelled. Consequently a more accurate definition of the current ratios can be achieved and smaller dimensions can be used for the transistors for a given accuracy.

The means for forming the difference may comprise means for inverting the current produced in one of the output branches and a summing junction to which the inverted current and the current from the other branches are applied. The inverting circuit may comprise a further current mirror circuit formed by transistors of the opposite conductivity type from the first, second and third transistors, the output of said one of the output branches being fed to the input of the further current mirror circuit and the output of the further current mirror circuit being coupled to the summing junction. This is a convenient construction when a CMOS process is being used to implement the circuit.

Alternatively, the current scaling circuit may comprise a current conveyor circuit having an x-input connected to an input branch, a y-input connected to a reference potential, first and second sub-output branches, means for forming the difference between the currents in the first and second sub-output branches, and means for feeding the difference current to the z-output of the current conveyor circuit.

Forming the scaling circuit as a current conveyor circuit enables a more accurate summing of currents at its inputs, due to the very low input impedances of the current conveyor circuit. Various embodiments of current conveyor circuits could be used, the embodiment described hereinafter with respect to FIG. 9 being only one example. In particular a current conveyor as disclosed in our co-pending UK Patent Application No. 8903705.5, which corresponds to U.S. Ser. No. 479,304, filed Feb. 13, 1990, could be modified in the manner disclosed in FIG 9.

The current scaling means may comprise means for regularly isolating the input branch from the sub-output branches and means for maintaining current flow in the sub-output branches when they are isolated from the input branch.

This enables the construction of a memory cell which may be used both to store and scale a current. Such circuits are required in order to implement switched current circuits.

The isolating means may comprise a switch controlled by a clock signal and the maintaining means may comprise a capacitor. If the capacitor is realized as a gate oxide or diffusion capacitor then the memory cell can be constructed using standard CMOS processes designed for digital VLSI circuits, thus enabling the integration of digital and analog signal processing circuitry on a single chip.

The current scaling means may be arranged to produce a scaled bi-directional output current from a bi-directional input current, the current scaling means comprising means for adding a bias current to the bi-directional input current to produce a uni-directional current, means for scaling the uni-directional current, and means for subtracting a suitably scaled bias current from the scaled uni-directional current to produce an output bi-directional current.

The current scaling means may be arranged to scale a differential input current to produce a scaled differential output current. This enables signal currents in differential form to be processed giving a reduction in common mode interference and even harmonic distortion.

The circuit arrangement may include a current memory circuit arranged to store a bi-directional input current comprising means for adding a bias current to the bi-directional input current to produce a uni-directional current, means for storing the uni-directional current, and means for subtracting a bias current from the stored uni-directional current to produce a bi-directional output current. The current memory circuit may be arranged to store a differential input current.

This enables bi-directional input signal currents to be handled without reverse biasing the input diode of the current mirror or current conveyor circuits and enables the provision of functional scaling, memory, integrator or differentiator modules which accept and produce bi-directional signal currents. All bias currents can be produced locally to the circuit modules enabling a closer matching of the bias sources since they can be fabricated physically close together on an integrated circuit substrate.

BRIEF DESCRIPTION OF THE DRAWINGS

Embodiments of the invention will now be described, by way of example, with reference to the accompanying drawings, in which:

FIG. 8 shows an analogue current memory circuit according to the invention, and

DESCRIPTION OF THE PREFERRED EMBODIMENTS

Figure 1:
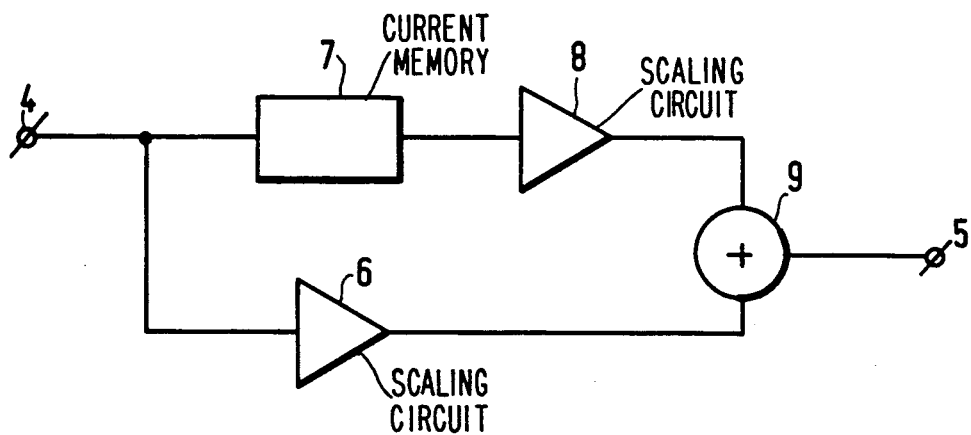
FIG. 1 shows in block schematic form an embodiment of a circuit arrangement according to the invention for processing sampled analogue electrical signals.

FIG. 1 shows one embodiment of a circuit arrangement according to the invention which comprises an input 4 for receiving an input signal in the form of a sampled analog current and an output 5 at which an output signal in the form of a sampled analog current is produced. The input 4 is connected the input of a scaling circuit 6 and to the input of a current memory circuit 7. The output of the current memory circuit 7 is connected via a further scaling circuit 8 to a first input of a combining circuit 9, while the output of the scaling circuit 6 is connected to a second input of the combining circuit. The output of the combining circuit 9 is connected to the output 5 of the circuit arrangement. The current memory circuit 7 is arranged to produce at its output during one sampling period a current which is dependent on the current applied to its input during the previous sampling period. The combining means 9 may comprise a current summing junction.

When sampled currents are fed to input 4, the current applied during a present sample period, scaled by a factor dependent on the construction of scaling circuit 6, is added to the current applied during the previous sample period, scaled by a factor dependent on the construction of scaling circuit 8, in the combining circuit 9 to produce an output current at output 5. At least one of the scaling circuits comprises a first branch for receiving a current to be scaled, second and third branches for producing first and second sub-output currents which are each proportional to the received current, means for forming the difference between the first and second sub-output currents, and means for feeding the difference current to the scaling circuit output. The scaling circuits may be constructed in various forms which are capable of scaling either unidirectional or bi-directional currents in either single ended or differential form and may, if desired, be formed integrally with the current memory circuit. Representative illustrative examples are shown in FIGS. 2 to 9 of this specification.

It should be noted the FIG. 1 shows only one of many possibilities for the circuit arrangement. For example, the output of the combining means 9 may be fed to the input of the current memory 7 instead of to the output 5 and with the output of the scaling circuit 8 connected additionally to the output 5. Additionally, more complex arrangements with more than one memory and/or combining means and with various feedback loops may be constructed.

Figure 2:
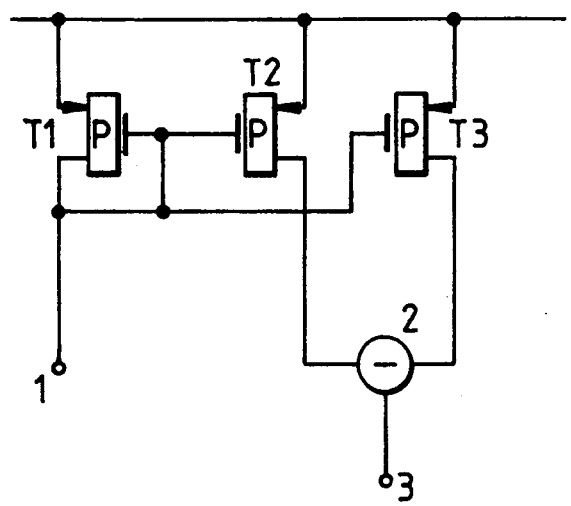
FIG. 2 shows a first embodiment of a current mirror circuit suitable for use in a circuit arrangement according to the invention.

FIG. 2 shows a current mirror circuit according to the invention which has an input connected to the drain electrode of a p-channel field effect transistor T1. The drain electrode of transistor T1 is connected to its gate electrode and to the gate electrodes of two further p-channel field effect transistors T2 and T3. The source electrodes of transistors T1, T2 and T3 are commoned. The drain electrode of transistors T2 is connected to a first input of a differencing circuit 2 while the drain electrode of transistor T3 is connected to a second input of the differencing circuit. The output of the differencing circuit 2 is connected to an output 3 of the current mirror circuit. The gate width/length ratio of transistors T1 and T2 is chosen to be 1:A1 and that of transistors T1 and T3 is chosen to be 1:A2. As a result, if a current i is applied to input 1 then the current produced at the drain electrode of transistor T2 will be equal to A1.i and that produced at the output of transistor T3 will be equal to A2.i. Consequently, the output current produced at output 3 will be (A1-A2).i.

Current mirror circuits may be used in switched current circuits as disclosed in U.K. Patent Application No. 8721758, which corresponds to U.S. Pat. No. 4,864,217 Sep. 5, 1989), to define coefficients used in the algorithm of a particular function. These coefficients are defined in practice by the ratio of the channel widths of the input diode-connected transistor and the output transistor forming the current mirror circuit. Where this ratio is an integer it can readily be implemented from multiples of unit transistors. However, generally the algorithm will produce coefficients which are non-integer and the transistor widths then have to be chosen to achieve the desired non-integer ratio. For example, if a coefficient of value 0.12 is required it could be formed by a diode connected transistor having a channel width of 100 $\mu$m and an output transistor having a channel width of 12 $\mu$m. However, transistors have 'edge-effects' which cause errors in the active, or effective width. These errors may be caused, for example, by incorrect mask dimensions or incorrectly etched windows. These effects may be lumped together as an error in the effective width of the transistor. In the numerical example given, if the width error is 1 ;82 m then the ratio of transistor widths becomes 101:13 which produces a coefficient error of 7%. Clearly, this error becomes greater as the coefficient becomes smaller. It could be improved by using transistors having a larger area but this is wasteful of chip area and limits the complexity of function which can be integrated on a single chip.

The current mirror circuit shown in FIG. 2 produces an output current (A1−A2) times the input current and thus the coefficient is defined by (A1−A2). Now, if a coefficient of 0.12 is required and a diode connected transistor having a width of 100 $\mu$m is provided as before, the widths of transistors T2 and T3 can be selected so that their difference is 12 $\mu$m, for example 56 $\mu$m and 44 $\mu$m. In that case, assuming an ideal case where the dimensions are exact, the current produced at the drain electrode of transistor T2 will be 0.56.i and that produced at the drain electrode of transistor T3 will be 0.44.i. As a result, the current at output 3 will then be 0.12.i as desired.

Now, if for a practical case the 'edge-effects' are defined by $\tau w/w$ then, where w is the nominal channel width and $\tau w$ is the difference between the actual and nominal channel widths, A1 becomes $$\frac{A1 + \tau w/w}{1 + \tau w/w}$$

and A2 becomes $$\frac{A2 + \tau w/w}{1 + \tau w/w}$$

therefore $$A1 - A2 = \frac{A1 - A2}{1 + \tau w/w} = \frac{0.56 - 0.44}{1 + 0.01} = \frac{0.12}{1.01}$$

That is, the error is 1%. This error remains $\tau w/w$ for all values of A1, A2 and A1−A2. Clearly, this error can be reduced still further by using larger transistors.

Figure 3:
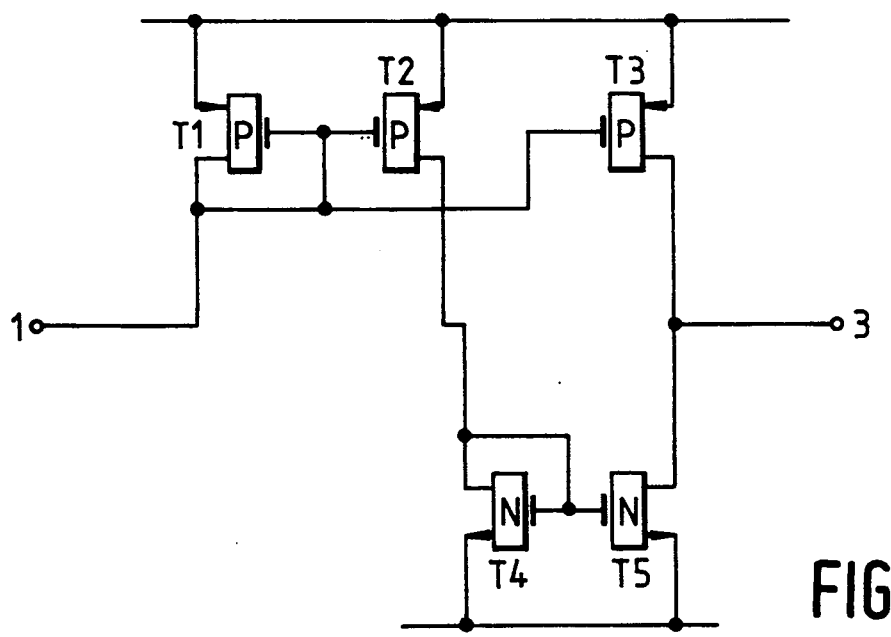
FIG. 3 shows a second embodiment of a current mirror circuit suitable for use in a circuit arrangement according to the invention.

FIG. 3 shows a second embodiment of a current mirror circuit forming scaling means for use in a circuit arrangement according to the invention. In FIG. 3, components corresponding to those in the current mirror circuit of FIG. 2 have been given the same reference labels. The circuit shown in FIG. 3 is similar to that shown in FIG. 2, the difference being that an embodiment of the differencing circuit 2 is shown in greater detail. As shown in FIG. 3, the drain electrode of transistor T2 is connected to the drain electrode of an n-channel field effect transistor T4. The drain electrode of transistor T4 is further connected to its gate electrode and to the gate electrode of an n-channel field effect transistor T5. The source electrodes of T4 and T5 are commoned. The drain electrode of transistor T3 is connected to the output 3 and to the drain electrode of transistor T5. As with the arrangement shown in FIG. 1, the channel width/length ratios of transistors T1, T2 and T3 are chosen so that the current produced at the drain electrode of transistor T2 is A1 times the input and the current produced at the drain electrode of transistor T3 is A2 times the input current. The current mirror circuit formed by transistors T4 and T5 is arranged to have a unity current ratio between its input and output branches.

In operation, when an input current −i is applied to input 1, a current A1.i is produced at the drain electrode of transistor T2 and is fed to the diode connected transistor T4. As a result the current A1.i is produced at the drain electrode of transistor T5. The input current −i also causes the current A2.i to be produced at the drain electrode of transistor T3 and consequently the current i(A2-31 A1) is produced at the output 3. This is equivalent to -31 (A1-31 A2).i. This assumes that a positive current is defined as one flowing into the input terminal 5 and out of the output terminal. It will be apparent to the person skilled in the art of analogue circuit design that if transistors T1 to T3 were n-channel devices and transistors T4 and T5 p-channel devices with appropriate power supply rails, then an output current of (A1−A2).i will be produced when an input current i is applied to the input.

Current mirror circuits are a useful circuit element in analog circuit design, though generally they are used with unity or integer gains. However, when used to implement switched current circuits, the ability to produce non-integer current ratios is particularly useful since in practice the coefficients defined by the algorithms used to produce a given circuit function will require non-integer current ratios. The current mirror circuits disclosed herein are shown for simplicity and clarity of explanation in their simplest form. However, if higher performance is required various enhancement techniques, such as the use of source degeneration resistors, the cascode connection of transistors, and dynamic element matching, may be incorporated.

Figure 4:
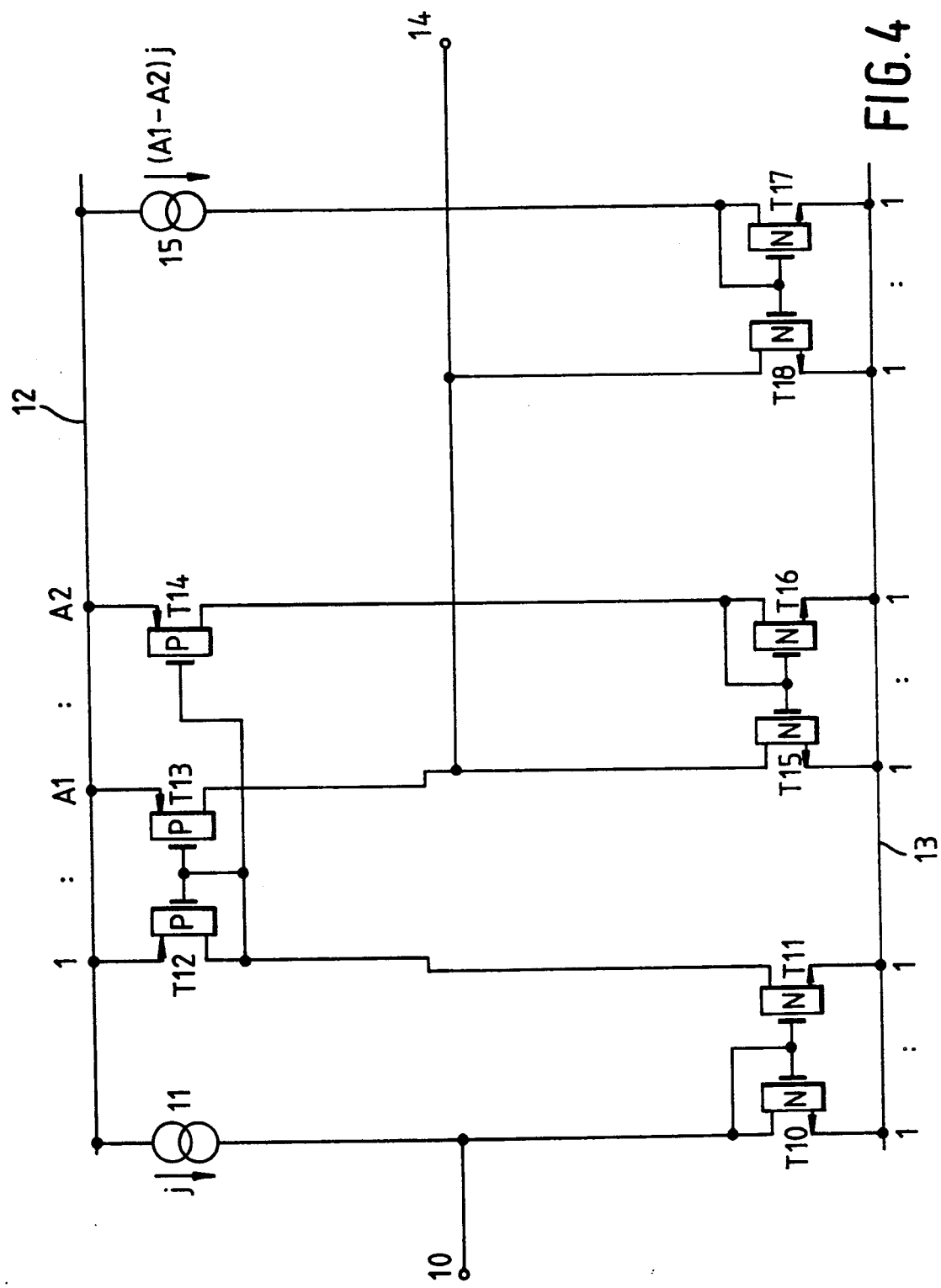
FIG. 4 shows a first embodiment of a current scaling circuit including a current mirror circuit as shown in FIG 3.

FIG. 4 shows a static module for use in a switched current circuit incorporating a current mirror circuit having a non-integer gain. The static module shown in FIG. 4 has an input 10 which is connected to the junction of a current source 11 and the drain electrode of an n-channel field effect transistor T10. The other end of the current source 11 is connected to a positive supply rail 12 while the source electrode of transistor T10 is connected to a negative supply rail 13. The drain electrode of transistor T10 is connected to its gate electrode and to the gate electrode of an n-channel field effect transistor T11 whose source electrode is connected to the negative supply rail 13 and whose drain electrode is connected to the drain electrode of a p-channel field effect transistor T12. The drain electrode of transistor T12 is connected to it gate electrode and to the gate electrodes of two further p-channel field effect transistors T13 and T14. The source electrodes of transistors T12, T13 and T14 are connected to the positive supply rail 12. The drain electrode of transistor T13 is connected to an output terminal 14 and to the drain electrode of an n-channel field effect transistor T15 whose source electrode is connected to the negative supply rail 13. The drain electrode of an n-channel field effect transistor T16 is connected to its gate electrode, to the gate electrode of transistor T15, and to the drain electrode of transistor T14. A current source 15 is connected between the positive supply rail 12 and the drain electrode of an n-channel field effect transistor T17. The drain electrode of transistor T17 is connected to its gate electrode and to the gate electrode of an n-channel field effect transistor T18 whose drain electrode is connected to the output terminal 14. The source electrodes of transistors T16, T17 and T18 are connected to the negative supply rail 13.

Transistors T10 and T11, transistors T15 and T16, and transistors T17 and T18 are constructed so that the corresponding current mirror circuits which they form each have a unity current ratio, while transistors T12, T13 and T14 are constructed so that the drain current of transistor T13 is A1 times that of transistor T12 and the drain current of transistor T14 is A2 times that of transistor T12, i.e., the channel width/length ratios of transistors T12, T13 and T14 are selected to follow the progression 1:A1:A2. The current source 11 is arranged to produce a bias current j while the current source 15 is arranged to produce a bias current (A1−A2)j.

In operation an input current i, which may have a value of up to −j without reverse biasing the diode connected transistor T10, is applied to the input 10. This causes a current i+j to be produced at the drain electrode of transistor T11 and consequently to be applied to transistor T12. This results in a current of A1(j+i) being produced at the drain electrode of transistor T13 and a current of A2(j+i) being produced at the drain electrode of transistor T14. Consequently, a current A2(j+i) is also produced at the drain electrode of transistor T15. In addition a bias current (A1−A2)j is produced at the drain electrode of transistor T18. As a result at terminal 14 an output current A1(j+i)−A2(-j+i)−(A1−A2)j=(A1−A2)i is produced. Thus the scaling circuit produces an output current which is the desired non-integer multiple of the input current.

Figure 5:
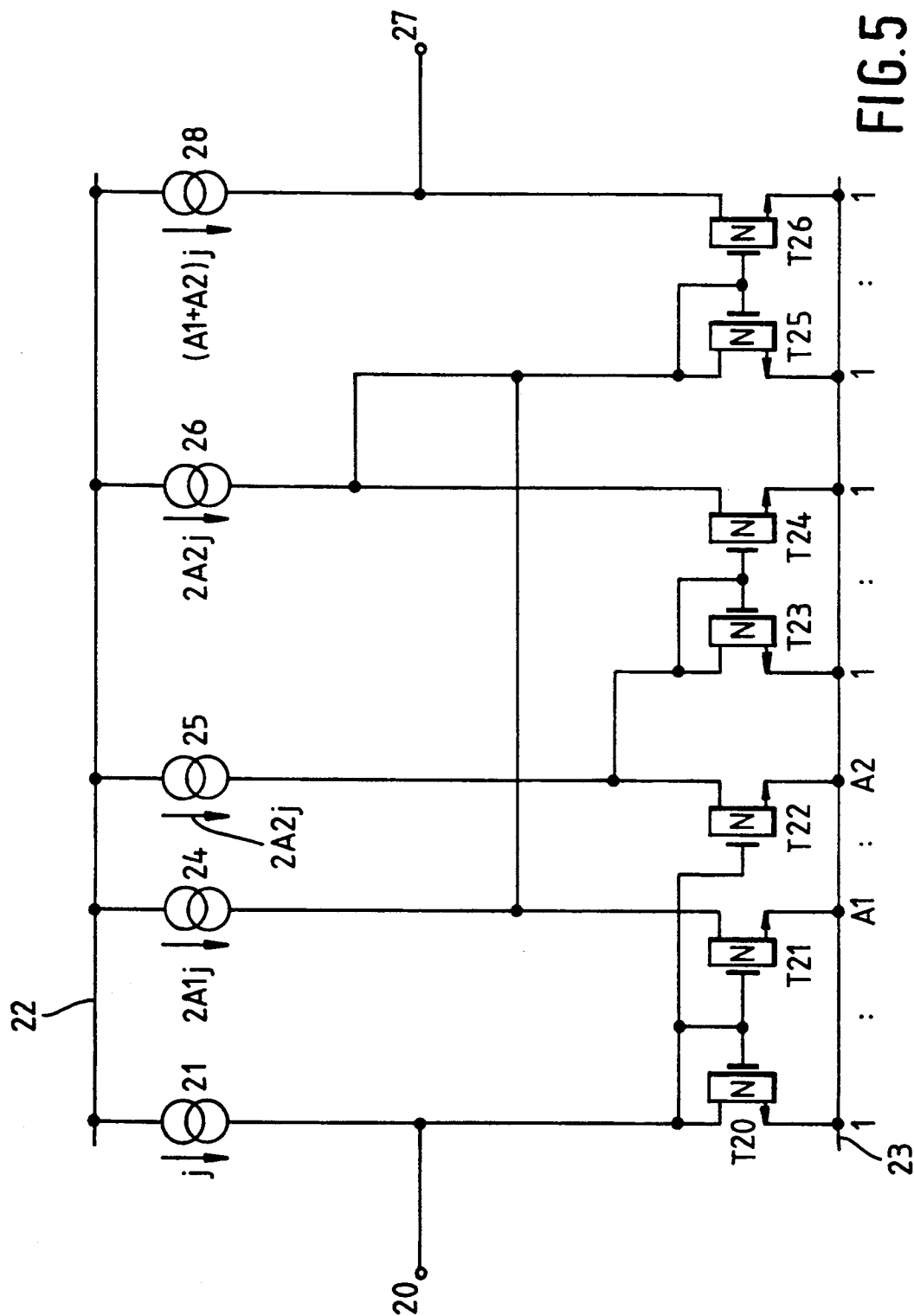
FIG. 5 shows a second embodiment of a current scaling circuit including a current mirror circuit as shown in FIG. 2.

FIG. 5 shows an alternative static module in which only current mirror circuits formed from n-channel field effect devices are employed. The module shown in FIG. 5 has an input 20 which is connected to the junction of a current source 21 and the drain electrode of an n-channel field effect transistor T20. The other end of the current source 21 is connected to a positive supply rail 22 while the source electrode of transistor T20 is connected to a negative supply rail 23. The drain electrode of transistor T20 is connected to its gate electrode and to the gate electrode of two further n-channel field effect transistors T21 and T22 whose source electrodes are connected to the negative supply rail 23. The drain electrodes of transistors T21 and T22 are connected via respective current sources 24 and 25 to the positive supply rail 22. The drain electrode of transistor T22 is further connected to the drain electrode of an n-channel field effect transistor T23 whose source electrode is connected to the negative supply rail 23. The drain electrode of transistor T23 is connected to its gate electrode and to the gate electrode of an n-channel field effect transistor T24 whose source electrode is connected to the negative supply rail 23. The drain electrode of transistor T24 is connected to the positive supply rail 22 via a current source 26. The drain electrode of transistor T24 is further connected to the drain electrode of transistor T21 and to the drain electrode of a further n-channel field effect transistor T25 whose source electrode is connected to the negative supply rail 23. The drain electrode of transistor T25 is connected to its gate electrode and to the gate electrode of an n-channel field effect transistor T26 whose source electrode is connected to the negative supply rail 23. The drain electrode of transistor T26 is connected to an output terminal 27 and, via a current source 28, to the positive supply rail 22.

Transistors T20, T21 and T22 form a first current mirror circuit comprising an input branch consisting of transistor T20 and first and second output branches consisting of transistors T21 and T22, respectively. The channel width/length ratios of transistors T20, T21 and T22 are chosen so that the ratios of the currents produced by the current mirror circuit are 1:A1:A2. Two further current mirror circuits consisting of transistors T23 and T24 and transistors T25 and T26 each have a 1:1 ratio. The current source 21 produces a current j, the current source 24 produces a current 2(A1)j, the current sources 25 and 16 each produce a current 2(A2)j, and the current source 28 produces a current (A1+A2)j.

In operation a current i, which may vary between ±j, is applied to the input terminal 20. As a result a current j+i will flow into the input branch of the first current mirror circuit (transistor T20). This causes the circuits A1(j+i) and A2(j+i) to flow in the two output branches. As a result a current of A2(j−i) flows into transistor T23 (2(A2)j−A2[j+i]). Thus the current A2(j−i) will flow in the output branch of the current mirror circuit formed by transistors T23 and T24. Consequently, the current flowing in the input branch of the current mirror circuit formed by transistors T25 and T26 will be equal to 2(A2)j+A1(j−i)−A2(j−i) or (A1+A2)j−(A1−A2)i. This current is produced in the output branch of the current mirror circuit and as a result the output current at terminal 27 is (A1+A2)j−(A1+A2)j+(A1−A2)i or (A1−A2)i. That is the output current is equal to the input current scaled by the factor (A1−A2).

In an inverting scaler is required, this can be realized by connecting the drain electrode of transistor T21 to the drain electrode of transistor T23 instead of to the drain electrode of transistor T25 and by connecting the drain electrode of transistor T22 to the drain electrode of transistor T25 instead of to the drain electrode of transistor T23.

Figure 6:
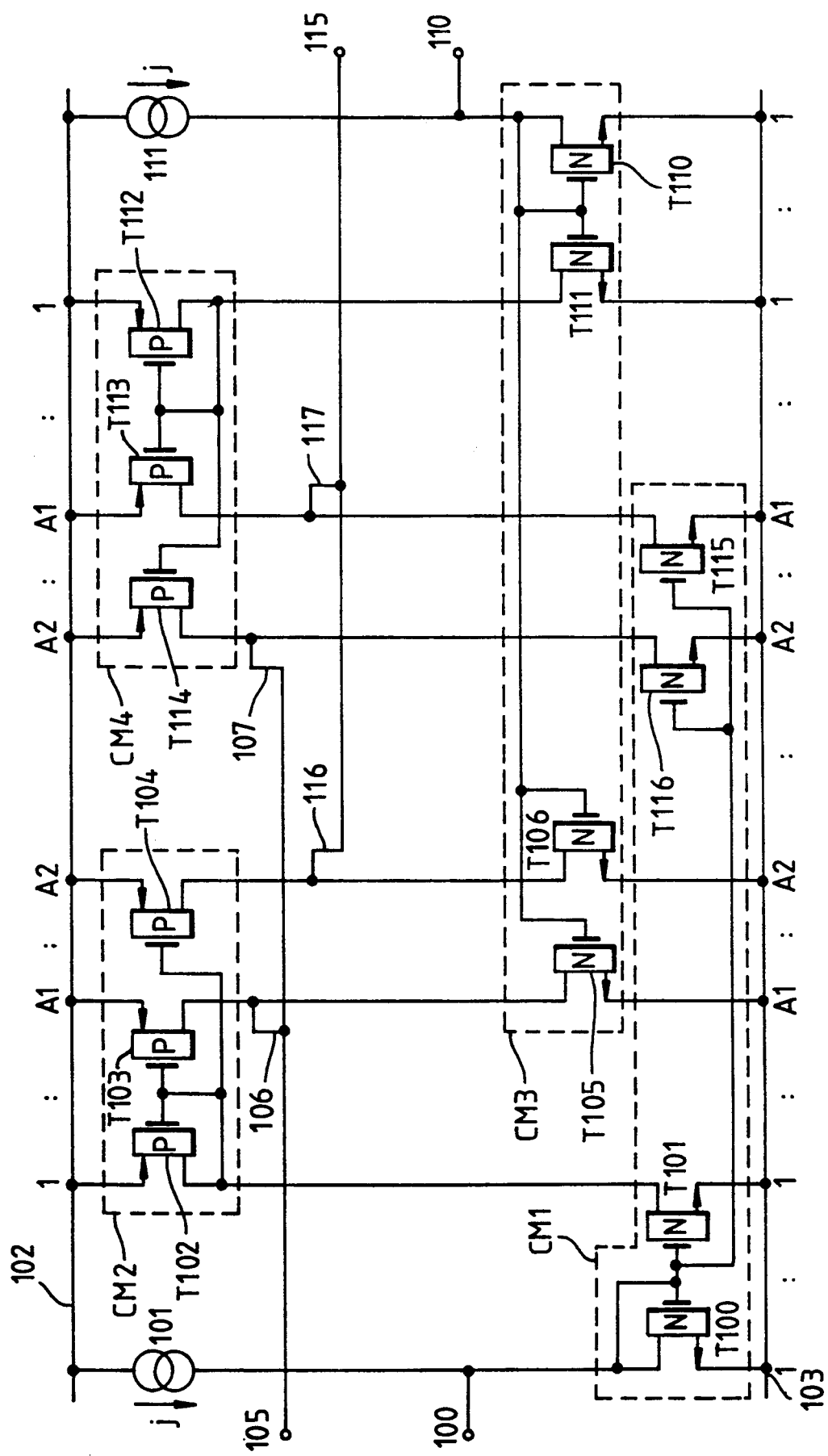
FIG. 6 shows a third embodiment of a current scaling circuit including a current mirror circuit as shown in FIG. 3.

FIG. 6 shows a fully balanced static module for processing differential input currents. The module shown in FIG. 6 has a first input 100 which is connected to the junction of a current source 101 and the drain electrode of an n-channel field effect transistor T100. The other end of the current source 101 is connected to a positive supply rail 102 while the source electrode of transistor T100 is connected to a negative supply rail 103. The drain electrode of transistor T100 is connected to its gate electrode and to the gate electrode of an n-channel field effect transistor T101 whose source electrode is connected to the negative supply rail 103. The drain electrode of transistor T101 is connected to the drain electrode of a p-channel field effect transistor T102 whose source electrode is connected to the positive supply rail 102. The drain electrode of transistor T102 is connected to its gate electrode and to the gate electrodes of two further p-channel field effect transistors T103 and T104, whose source electrodes are connected to the positive supply rail 102.

A second input terminal 110 is connected to the junction of a current source 111 and the drain electrode of an n-channel field effect transistor transistor T110. The other end of the current source 111 is connected to the positive supply rail 102 while the source electrode of transistor T110 is connected to the negative supply rail 103. The drain electrode of transistor T110 is connected to its gate electrode and to the gate electrode of a further n-channel field effect transistor T111 whose source electrode of transistor T111 is connected to the drain electrode of a p-channel field effect transistor T112 whose source electrode is connected to the positive supply rail 102. The drain electrode of transistor T112 is connected to its gate electrode and to the gate electrodes of two further p-channel field effect transistors T113 and T114 whose source electrodes are connected to the positive supply rail 102.

The drain electrode of transistor T103 is connected to the drain electrode of an n-channel field effect transistor T105 and to an output terminal 105, while the drain electrode of transistor T104 is connected to the drain electrode of an n-channel field effect transistor T106 and to an output terminal 115. Similarly, the drain electrode of transistor T113 is connected to the drain electrode of an n-channel field effect transistor T115 and to the output terminal 15, while the drain electrode of transistor T114 is connected to the drain electrode of an n-channel field effect transistor T116 and to the output terminal 105. The gate electrodes of transistors T105 and T106 are connected to the gate electrode of transistor T110 while the gate electrodes of transistors T115 and T116 are connected to the gate electrode of transistor T100. The source electrodes of transistors T105, T106, T115 and T116 are all connected to the negative supply rail 103.

As can be seen from FIG. 6, the static module comprises four interconnected current mirror circuits. The first current mirror circuit CM1 comprises an input branch consisting of the diode connected transistor T100 and first, second, and third output branches consisting of transistors T101, T115 and T116 respectively. The ratios between the currents in the input branch and those of the first, second and third output branches are 1:1:A1:A2. The second current mirror circuit CM2 comprises an input branch consisting of the diode connected transistor T102 and first and second output branches consisting of transistors T103 and T104, respectively. The ratios between the currents in the input branch and those in the first and second output branches are 1:A1:A2. The third current mirror circuit CM3 comprises an input branch consisting of the diode connected transistor T110 and first, second and third output branches consisting of the transistors T111, T105 and T106, respectively. The ratios between the currents in the input branch and those in the first, second and third output branches are 1:1:A1:A2. The fourth current mirror circuit CM4 comprises an input branch consisting of the diode connected transistor T112 and first and second output branches consisting of transistors T113 and T114, respectively. The ratios between the currents in the input branch and those in the first and second output branches are 1:A1:A2.

If a differential input current is applied to inputs 100 and 110, giving a current $i^+$ at input 100 and $i^-$ at input 110 then a current $J+i^+$ will flow in the input branch of the first current mirror circuit and a current $j+i^-$ will flow in the input branch of the third current mirror circuit. Thus a current $j+i^+$ will flow in the first output branch of the first current mirror circuit and be applied to the input branch of the second current mirror circuit. Consequently the currents $A1(j+i^+)$ and $A2(j+i^+)$ will be produced by the first and second output branches of the second current mirror circuit. Similarly the first and second outputs of the fourth current mirror circuit will produce the currents $A1(j+i^-)$ and $A2(-j+i^-)$ respectively. The second and third branches of the first current mirror circuit will produce the currents $A1(j+i^+)$ and $A2(j+i^+)$ respectively while the second and third outputs of the third current mirror circuit will produce the currents $A1(j+i^-)$ and $A2(j+i^-)$ respectively. As a result the current produced on line 106 ($I_1$) will be equal to $A1(i^+31\ i^-)$ and that produced on line 107 ($I_3$) will be equal to $A2(i^- - i^+)$ which may also be written as $$A2(i^+ - i^-).$$

Similarly the current produce on line 116 ($I_2$) will be equal to $A1(i^- - i^+)$ which may also be written as $$A1(i^- - i^-).$$

Thus the current at output 105 is $I_1 + I_3 = (A1 - A2)(i^+ - i^-)$ and that at output is $I_2 + I_4 = -(A1 - A2)(i^+ - i^-)$. thus the differential input current has been scaled by the factor $(A1-A2)$ using current mirror circuits of the form shown in FIGS. 2 and 3.

Figure 7:
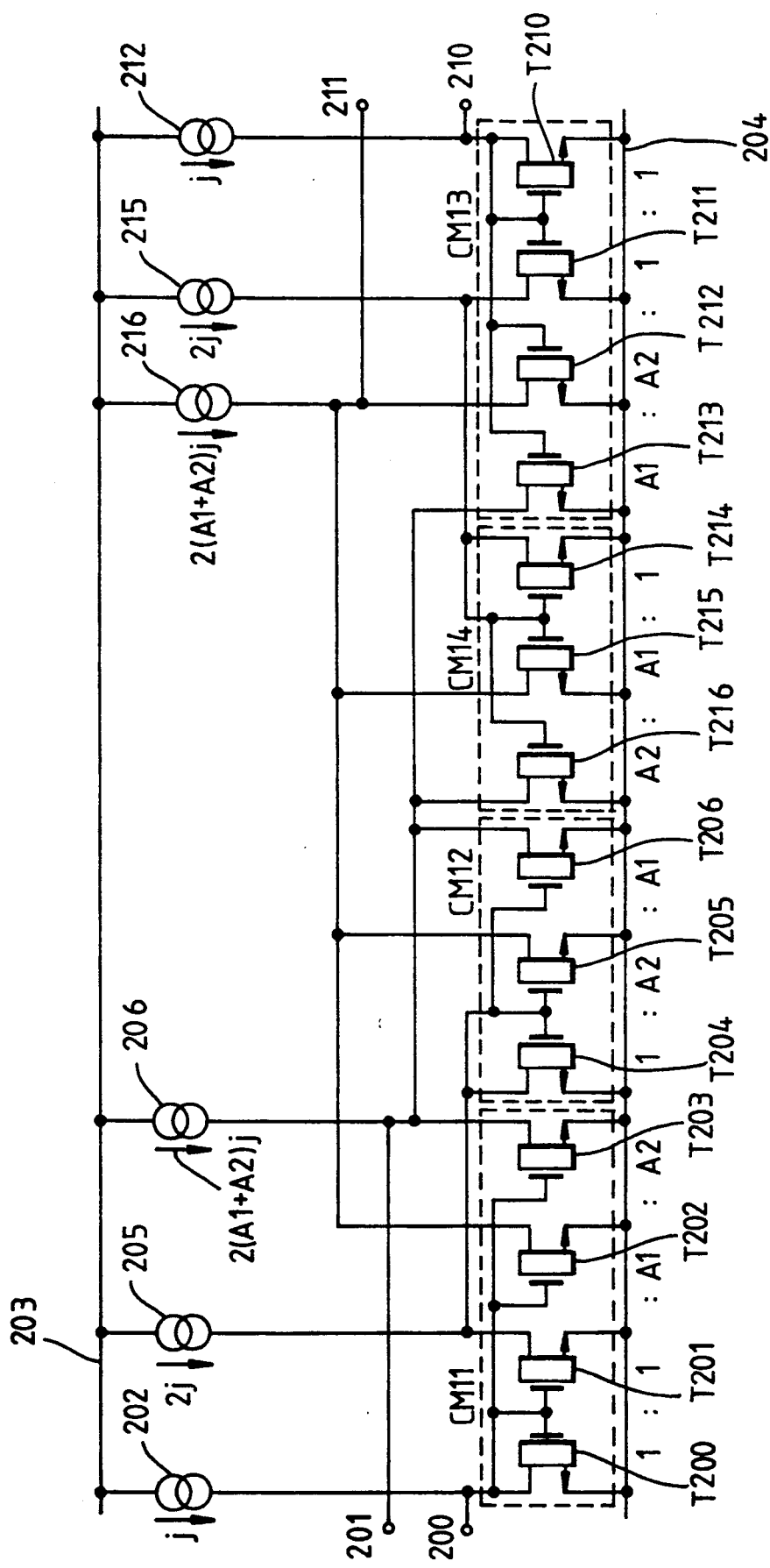
FIG. 7 shows a sixth embodiment of a current scaling circuit including a current circuit as shown in FIG. 2.

FIG. 7 shows a fully balanced static module for processing differential input currents using only n-channel field effect transistors to form current mirror circuits which handle signal currents. The arrangement shown in FIG. 7 has first and second inputs 200 and 210 and first and second outputs 201 and 211. The input 200 is connected to the junction of a current source 202 and the drain electrode of an n-channel field effect transistor T200. The other end of the current source 202 is connected to a positive supply rail 203 while the source electrode of transistor T200 is connected to a negative supply rail 204. The drain electrode of transistor T200 is connected to its gate electrode and to the gate electrodes of three further n-channel field effect transistors T201, T202 and T203 whose source electrodes are connected to the negative supply rail 204. The drain electrode of transistor T201 is connected to the drain electrode of an n-channel field effect transistor T204 and, via a current source 205, to the positive supply rail 203. The drain electrode of transistor T203 is connected to the output terminal 201 and, via a current source 206, to the positive supply rail 203. The drain electrode of transistor T202 is connected to the output terminal 211.

The input 210 is connected to the junction of a current source 212 and the drain electrode of an n-channel field effect transistor T210. The other end of the current source 212 is connected to the positive supply rail 203 while the source electrode of transistor T210 is connected to the negative supply rail 204. The drain electrode of transistor T210 is connected to its gate electrode and to the gate electrodes of three further n-channel field effect transistors T211, T212 and T213 whose source electrodes are connected to the negative supply rail 204. The drain electrode of transistor T211 is connected to the drain electrode of an n-channel field effect transistor T214 and, via a current source 215, to the positive supply rail 203. The drain electrode of transistor T212 is connected to the output terminal 211 and, via a current source 216, to the positive supply rail 203. The drain electrode of transistor T213 is connected to the output terminal 201.

The drain electrode of transistor T204 is connected to its gate electrode and to the gate electrodes of two further n-channel field effect transistors T205 and T206 whose source electrodes are connected to the negative supply rail 204. The drain electrode of transistor T214 is connected to its gate electrode and to the gate electrodes of two further n-channel field effect transistors T215 and T216 whose source electrodes are connected to the negative supply rail 204. The drain electrode of transistor T206 is connected to the drain electrode of transistors T203, T213 and T216 while the drain electrode of transistors T202, T212 and T215.

The module can be seen to comprise four current mirror circuits and a number of current sources. The first current mirror circuit CM11 comprises an input branch consisting of transistor T200 and first, second and third output branches consisting of transistors T201, T202 and T203 respectively. The channel width/length ratio of transistors T200 to T203 are chosen so that the current ratios between the input branch and the first, second and third output branches of the first current mirror circuit are 1:1:A1:A2. The second current mirror circuit CM12 comprises an input branch consisting of transistor T204 and first and second output branches consisting of transistors T205 and T206, respectively. The channel width/length ratios of transistors T204, T205 and T206 are chosen so that the current ratios between the input branch and the first and second output branches of the second current mirror circuit are 1:A2:A1. The third current mirror circuit CM13 comprises an input branch consisting of transistor T210 and first, second, and third output branches consisting of transistors T211, T212 and T213, respectively. The channel width/length ratios of transistors T210 to T213 are chosen so that the ratios of the currents produced by the third current mirror circuit are 1:1:A2:A1. The fourth current mirror circuit CM14 comprises an input branch consisting of transistor T214 and first and second output branches consisting of transistors T215 and T216 respectively. The channel width/length ratios of transistors T214, T215 and T216 are chosen so that the ratios of the currents produced by the fourth current mirror circuit are 1:A1:A2. The current sources 202 and 212 are constructed to produce a current having the value j. The current sources 205 and 215 are constructed to produce a current having the value 2j, and the current sources 216 and 216 are constructed to produce a current $2(A1+A2)j$.

In operation, a differential input current is applied to the inputs 200, 210. As a result a current $j+i^+$ is applied to the input branch of the first current mirror circuit and the currents $j+i^+$, $A1(j+i^+)$ are produced at its first, second and third output branches respectively. A current of $2j-(j+i^+)$ or $j-i^+$ is applied to the input branch of the second current mirror circuit and consequently the currents $A2(j-i^+)$ and $A1(j-i^+)$ are produced at its first and second outputs. Similarly, currents of $j+i^-$, $A2(j+i^-)$, and $A1(j+i^-)$ are produced at the first, second and third output branches, respectively, of the third current mirror circuit. A current of $2j-(j+i^-)$ or $j-i^-$ is applied to the input branch of the fourth current mirror circuit and consequently the currents $A1(j-i^-)$ and $A2(j-i^-)$ are produced at its first and second outputs. The current at output 201 is equal to the current produced by the current source 206 minus the sum of the currents produced in the third output branch of the first current mirror circuit, the second output branch of the second current mirror circuit, the second output branch of the fourth current mirror circuit and the third output branch of the third current mirror circuit. That is:

$$\begin{aligned}
i_o^+ &= 2(A1 + A2)j - A2(j + i^+) - A1(j - i^+) - \\
&\quad A2(j - i^-) - A1(j + i^-) \\
&= 2(A1 + A2)j - 2j(A2 + A1) - A2(i^+ - i^-) + \\
&\quad A1(i^+ - i^-) \\
&= (A1 - A2)(i^+ - i^-).
\end{aligned}$$

It can be similarly derived that the current at output 211 is given by:

$$i_o^- = -(A1-A2)(i^+ - i^-).$$

Thus, an input differential current $(i^+ - i^-)$ applied to inputs 200, 210 has been scaled by the static module shown in FIG. 7 to produce an output scaled differential current $$i_o^+ - i_o^- = [(A1 - A2)(i^+ - i^-) + (A1 - A2)(i^+ - i^-)]$$
$$= 2(A1 - A2)(i^+ - i^-).$$

FIG. 8 shows an analogue current memory circuit having an input terminal 300 which is connected to the junction of a current source 301 and the drain electrode of an n-channel field effect transistor T300. The other end of the current source 301 is connected to a positive supply rail 302 while the source electrode of transistor T300 is connected to a negative supply rail 303. The drain electrode of transistor T300 is connected to its gate electrode and to one end of a switch S300. The other end of the switch S300 is connected to the junction of a capacitor C300 and to the gate electrode of an n-channel field effect transistor T301. The other end of the capacitor C300 and the source electrode of transistor T301 are connected to the negative supply rail 303. The drain electrode of transistor T301 is connected to the drain electrode of a p-channel field effect transistor T302 whose source electrode is connected to the positive supply rail 302. The drain electrode of transistor T302 is connected to its gate electrode and to one end of a switch S301. The other end of the switch S301 is connected to the junction of a capacitor C301 and to the gate electrodes of two further p-channel field effect transistors T303 and T304. The other end of capacitor C301 and the source electrodes of transistors T303 and T304 are connected to the positive supply rail 302. The drain electrode of transistor T304 is connected to the drain electrode of an n-channel field effect transistor T305 whose source electrode is connected to the negative supply rail 303 while the drain electrode of transistor T303 is connected to the drain electrode of an n-channel field effect transistor T306 whose source electrode is connected to the negative supply rail 303. The drain electrode of transistor T305 is connected to its gate electrode and to the gate electrode of transistor T306. A current source 304 is connected between the positive supply rail 302 and the drain electrode of an n-channel field effect transistor T307 whose source electrode is connected to the negative supply rail 303. The drain electrode of transistor T307 is connected to it gate electrode and to the gate electrode of an n-channel field effect transistor T308 whose source electrode is connected to the negative supply rail 303. The drain electrode of transistor T306 is connected to the drain electrode of transistor T308 and to an output terminal 305. The channel width/length ratios of transistors T302, T303 and T304 are chosen so that they conduct currents in the ratios 1:A1:A2. The other current mirror circuits have a unity current ratio. The current source 301 is arranged to produce a current j while the current source 304 is arranged to produce a current (A1−A2)j.

In operation a sampled current i is applied to input 300 and the switches S300 and S301 are operated by non-overlapping clock signals $\phi$ and $\phi$ which occur once in each sampling period. Thus, in sampling period n a signal $i_n$ is applied to input 300. As a result a current $j+i_n$ is applied to the diode connected transistor T300 and during the $\phi$ phase of the clock signal switch S300 is closed, capacitor C300 becomes charged to the gate source potential of transistor T300, and the current $j+i_n$ is produced at the drain electrode of transistor T301. At the end of the $\phi$ phase of the clock signal the switch S300 opens but the current through transistor T301 is maintained at $j+i_n$ by the charge on capacitor C300 and is applied to the diode connected transistor T302. During the $\phi$ phase of the clock signal the switch S301 is closed, capacitor C301 is charged to the gate source potential of transistor T302, and transistors T303 and T304 conduct the currents A1($j+i_n$) respectively. At the end of the $\phi$ phase of the clock signal switch S301 opens but the currents through transistors T303 and T304 are maintained by the charge on capacitor C301.

The current A2($j+i_n$) produced by transistor T304 is fed to the input branch of the current mirror circuit formed by transistors T305 and T306 and consequently transistor T306 conducts the current A2($j+i_n$). The current source 304 produces the current (A1−A2)j which is fed to the input branch of the current mirror circuit formed by transistors T307 and T308 and consequently conducts the current (A1−A2)j. Thus summing the currents connected to the output terminal 305 gives:

$$i_{o(n+1)} = A1(j + i_n) - A2(j + i_n) - (A1 - A2)j$$
$$= (A1 - A2)i_n.$$

That is, the current memory circuit produces an output in one sampling period which is a scaled version (by a factor A1−A2) of the current applied to its input in the preceding sampling period.

It can be seen that transistors T302 to T306 form a current mirror circuit as shown in and described with reference to FIG. 2 which has been modified by inserting a switch S301 to isolate the input and output branches and providing a capacitor C301 to enable current flow to be maintained in the output branches when the switch is opened. Clearly current memory circuits which are analogous to the various current scaling circuits shown in FIGS. 5 to 7 could readily be devised by persons skilled in the art, the current memory circuit shown in FIG. 8 being analogous to the current scaling circuit shown in FIG. 4.

Current mirror circuits using the difference between currents in two sub-output branches may be used to construct any of the current scaling, current memory, or current integrator circuits disclosed in UK Patent Application No. 8816072.6 which corresponds to U.S. Pat. No. 4,958,123 (Sep. 18, 1990), the contents of which are hereby incorporated by reference, or any other similar circuits using current mirror circuits to determine the gain of the circuit.

It should be noted that the capacitors in any of the current memory circuits disclosed herein can be connected between the gate electrode of the respective transistor and any point of fixed potential. In particular it is not necessary to connect the capacitor between the gate and source electrodes of the transistor. It is only necessary that the capacitor is able to store a charge which is dependent on the input current and maintain a gate voltage which maintains the output current when the associated switch is open. Clearly, the most convenient points of fixed potential are the positive and negative supply rails, but if any other fixed voltages are generated in or supplied to the circuit they could equally be used.

Figure 9:
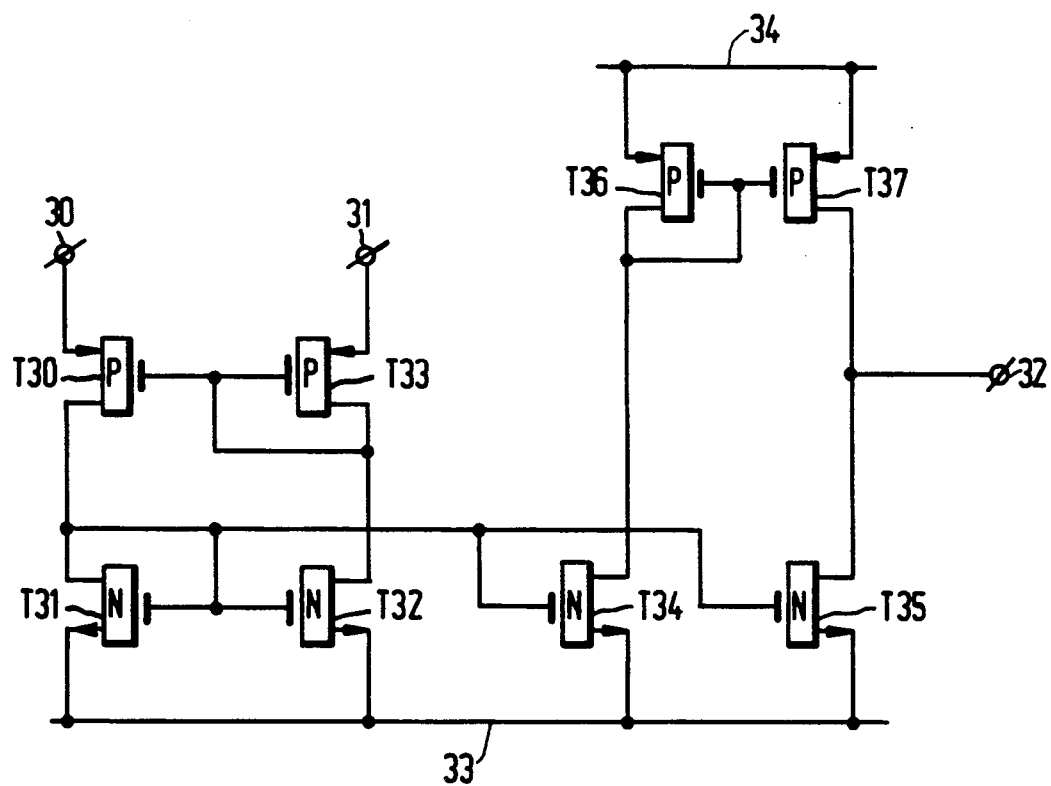
FIG. 9 shows an embodiment of a current conveyor circuit suitable for forming current scaling means for use in a circuit arrangement according to the invention.

Instead of using current mirror circuits to determine the scaling factors of the static or memory modules, it is possible and may be advantageous in certain circumstances to use current conveyor circuits. FIG. 9 shows an embodiment of such a current conveyor circuit which comprises an input 30, which is the x-input of the current conveyor, and which is connected to the source electrode of a p-channel field effect transistor T30 whose drain electrode is connected to the drain and gate electrodes of an n-channel field effect transistor T31. The gate electrode of transistor T31 is connected to the gate electrode of an n-channel field effect transistor T32 whose drain electrode is connected to the drain and gate electrodes of a p-channel field effect transistor T33. The source electrodes of transistors T31 and T32 are connected to a negative supply rail 33 while the source electrode of transistor T33 is connected to a terminal 31 which forms the y-input of the current conveyor circuit. The gate electrode of transistor T32 is connected to the gate electrodes of two further n-channel field effect transistors T34 and T35 whose source electrodes are connected to the negative supply rail 33. The drain electrode of transistor T34 is connected to the drain and gate electrodes of a p-channel field effect transistor T36 whose source electrode is connected to a positive supply rail 34. The drain electrode of transistor T35 is connected to the drain electrode of a p-channel field effect transistor T37 and to an output terminal 32 which forms the z-output of the current conveyor circuit. The source electrode of transistor T37 is connected to the positive supply rail 34 while its gate electrode is connected to the gate electrode of transistor T36.

The gate width/length ratio of transistors T31 and T34 is chosen to be 1:A1 while the gate width/length ratio of transistors T31 and T35 is chosen to be 1:A2 so that the current through transistor T34 is A1 times that through transistor T31 while the current through transistor T35 is A2 times that through transistor T31. Thus, if a current i is applied to input 30 transistor T34 will conduct a current A1.i and transistor T35 will conduct a current A2.i. Transistors T36 and T37 are constructed with identical channel width to length ratios and as a result the output current at output 32 will be (A1−A2)i. That is the input current will be scaled by a factor (A1−A2). This is clearly analogous to the current mirror circuits shown in FIGS. 2 and 3 and consequently this circuit can be used for the same functions.

The current conveyor circuit shown in FIG. 9 is an example of a first generation current conveyor (CCI) but clearly a second generation current conveyor (CC2) such as that shown in UK Patent Application No. 8903705.5, which corresponds to U.S. application Ser. No. 479,304 (Feb. 13, 1990), could be modified in the same way. Clearly, techniques to improve the basic current conveyor performance such as the cascode connection of transistors, the use of source degeneration resistors, or dynamic element matching could additionally be incorporated.

The current scaling and current memory circuits shown in FIGS. 4 to 8 could all have the current mirror circuits having two sub-output branches whose difference current forms their output current substituted by current conveyor circuits as shown in FIG. 9 or modified as disclosed herein. In the case of the current memory circuit it is advantageous to include a switch between the gate electrodes of transistors T30 and T33 as well as between either the gate and drain electrodes of transistor T31 or the gate electrodes of transistors T31 and T32.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any modifications of one or more of those features which would be obvious to persons skilled in the art, whether or not it relates to the same invention as presently claimed in any claim and whether or not it mitigates any or all of the same technical problems as does the present invention.

I claim:

1. A circuit arrangement for processing sampled analogue electrical signals, each sample being in the form of a current, the circuit arrangement comprising: means for combining in predetermined proportions an input sample current in a present sample period with current(s) derived from input sample current(s) in one or more preceding sample periods, and means for deriving a processed output signal as or from the combined current produced by the combining means in successive sample periods, and for scaling a current, which scaling means comprises a first branch for receiving a current to be scaled, second and third branches for producing first and second sub-output currents which are proportional to the received current, means for forming a difference current between the first and second sub-output currents, and means for feeding the difference current to the output of the current scaling means.

2. A current mirror circuit arrangement for scaling a current comprising: an input branch including a first diode connected field effect transistor, a first sub-output branch including a second field effect transistor, and a second sub-output branch including a third field effect transistor, means for forming a current which is the difference between currents in the first and second sub-output branches, and means for feeding the difference current to an output of the current mirror circuit.

3. A current mirror circuit arrangement as claimed in claim 2 wherein the means for forming the difference current comprises means for inverting the current produced in one of the sub-output branches, and means for applying to a summing junction the inverted current and a current from the other sub-output branch.

4. A current mirror circuit arrangement as claimed in claim 3 wherein the inverting circuit comprises a further current mirror circuit including transistors of the opposite conductivity type from the first, second and third transistors, and wherein an output of said one of the sub-output branches is fed to an input of the further current mirror circuit and an output of the further current mirror circuit is coupled to the summing junction.

5. A circuit arrangement as claimed in claim 1 wherein the means for scaling a current comprise a current conveyor circuit, said current conveyor circuit comprising an x-input connected to an input branch for receiving the current to be scaled, a y-input connected to a reference potential, first and second sub-output branches for producing said first and second sub-output currents which are proportional to the received current, said current conveyor circuit also including said means for forming the difference between the first and second sub-output currents and wherein said feeding means feeds the difference current to the z-output of the current conveyor circuit.

6. A current mirror arrangement as claimed in claim 2 wherein the current scaling means comprises means for regularly isolating the input branch from the sub-output branches and means for maintaining current flow in the sub-output branches when they are isolated from the input branch.

7. A current mirror circuit arrangement as claimed in claim 6 wherein the isolating means comprises a switch controlled by a clock signal and the maintaining means comprises a capacitor.

8. A current mirror circuit arrangement as claimed in claim 7 in which the capacitor is connected between the source and gate electrodes of the second field effect transistor.

9. A circuit arrangement as claimed in claim 1 wherein the current scaling means produce a scaled bi-directional input current, the current scaling means comprising: means for adding a bias current to the bi-directional input current to produce a uni-directional current, wherein said scaling means scales the uni-directional current, and means for subtracting a suitably scaled bias current from a scaled unit-directional current to produce an output bi-directional current.

10. A circuit arrangement as claimed in claim 9, wherein said current scaling means are arranged to scale a differential input current to produce a scaled differential output current.

11. A circuit arrangement as claimed in claim 1 further comprising a current mirror circuit as claimed in claim 6.

12. A circuit arrangement as claimed in claim 11 wherein the current mirror circuit comprises a current memory circuit arranged to store a bi-directional input current comprising means for adding a bias current to the bi-directional input current to produce a uni-directional current, means for storing the uni-directional current, and means for subtracting a bias current from the stored uni-directional current to produce a bi-directional output current.

13. A circuit arrangement as claimed in claim 11 wherein the current mirror circuit is arranged to store a differential input current.

14. A circuit arrangement as claimed in claim 1 wherein the current scaling means comprises means for regularly isolating the first branch from the second and third branches and means for maintaining current flow in the second and third branches when they are isolated from the first branch.

15. A current mirror circuit arrangement as claimed in claim 2 wherein the current scaling means produce a scaled bi-directional output current from a bi-directional input current, the current scaling means comprising: means for adding a bias current to the bi-directional input current to produce a uni-directional current, wherein said scaling means scales the uni-directional current, and means for subtracting a suitably scaled bias current from a scaled uni-directional current to produce an output bi-directional current.

16. A circuit for processing sampled analog electric current signals comprising:
an input for receiving sampled analog current signals,
means for combining an input sample current in a sample period with a current derived form an input sample current received in at least one preceding sample period,
a current memory circuit and a first current scaling circuit connected in cascade between said input and a first input of said combining means,
a second current scaling circuit connected between said input and a second input of the combining means, and
an output terminal coupled to an output of said combining means,
wherein at least one of said current scaling circuits comprises;
a first branch circuit for receiving a current to be scaled,
second and third sub-output branch circuits for supplying first and second sub-output currents proportional to the current in the first branch circuit, and
means responsive to said first and second sub-output currents for deriving a difference current thereof at an output of said current scaling circuit.

17. A processing circuit as claimed in claim 16 wherein said difference current deriving means comprises means for inverting the current produced in one of the sub-output branch circuits, and means for applying to a summing junction the inverted current and a current from the other sub-output branch circuit.

18. A processing circuit as claimed in claim 15 wherein said first, second and third branch circuits together form a first current mirror circuit comprising a first diode connected field effect transistor in the first branch circuit and second and third field effect transistors in the second and third branch circuits, respectively, said difference current deriving means receiving said first and second sub-output currents thereby to supply the difference current to an output of the first current mirror circuit.

19. A processing circuit as claimed in claim 16 wherein said first, second and third branch circuits together form a first current mirror circuit comprising a first diode-connected field effect transistor in the first branch circuit and second and third field effect transistors in the second and third branch circuits, respectively, said difference current deriving means comprising means for inverting the current produced in one of the sub-output branch circuits, and means for applying to a summing junction the inverted current and a current from the other sub-output branch circuit, wherein said first, second and third field effect transistors are of the same conductivity type, and wherein
the inverting circuit comprises a further current mirror circuit including transistors of the opposite conductivity type to that of the first, second and third field effect transistors, and wherein an output of said one of the sub-output branch circuits is fed to an input of the further current mirror circuit and an output of the further current mirror circuit is coupled to the summing junction.

20. A processing circuit as claimed in claim 16 wherein said current memory circuit comprises first and second current mirror circuits each of which comprises:
an input branch circuit and an output branch circuit, switching means for periodically isolating the input branch circuit from the output branch circuit,
an energy storage element in the output branch circuit to maintain a current flow in the output branch circuit during those time periods when the input branch circuit is periodically isolated from the output branch circuit, and wherein
the output branch circuit of the first current mirror circuit is coupled to the input branch circuit of the second current mirror circuit and the output branch circuit of the second current mirror circuit is coupled to an input of the first current scaling circuit.

* * * * *